US010431287B2

(12) United States Patent
Tanaka et al.

(10) Patent No.: US 10,431,287 B2
(45) Date of Patent: Oct. 1, 2019

(54) SEMICONDUCTOR MEMORY DEVICE INCLUDING A MEMORY CELL WITH FIRST AND SECOND TRANSISTORS

(71) Applicant: Toshiba Memory Corporation, Minato-ku (JP)

(72) Inventors: Chika Tanaka, Fujisawa (JP); Keiji Ikeda, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/705,864

(22) Filed: Sep. 15, 2017

(65) Prior Publication Data

US 2018/0277192 A1     Sep. 27, 2018

(30) Foreign Application Priority Data

Mar. 21, 2017    (JP) .................................. 2017-054791

(51) Int. Cl.

| G11C 11/404 | (2006.01) |
|---|---|
| G11C 11/4096 | (2006.01) |
| G06N 3/04 | (2006.01) |
| H01L 27/12 | (2006.01) |
| H01L 27/108 | (2006.01) |
| G11C 11/56 | (2006.01) |
| G11C 7/10 | (2006.01) |

(Continued)

(52) U.S. Cl.
CPC .............. *G11C 11/404* (2013.01); *G06N 3/04* (2013.01); *G11C 7/1006* (2013.01); *G11C 11/4091* (2013.01); *G11C 11/4096* (2013.01); *G11C 11/54* (2013.01); *G11C 11/565* (2013.01); *H01L 27/10805* (2013.01); *H01L 27/1225* (2013.01)

(58) Field of Classification Search
CPC ........................................................ G06N 3/06
USPC .......................................................... 706/45
See application file for complete search history.

(56) References Cited

U.S. PATENT DOCUMENTS

| 5,053,638 A | 10/1991 | Furutani et al. | |
|---|---|---|---|
| 5,216,746 A * | 6/1993 | Yoshizawa | ............... G06N 3/04 706/25 |

(Continued)

FOREIGN PATENT DOCUMENTS

| JP | 02-310666 | 12/1990 |
|---|---|---|
| JP | 2009-080892 | 4/2009 |

(Continued)

OTHER PUBLICATIONS

Takeo Ohno, et al., "Short-term plasticity and long-term potentiation mimicked in single inorganic synapses," Aug. 2011, Nature Materials vol. 10, pp. 591-595.

*Primary Examiner* — Hoai V Ho
(74) *Attorney, Agent, or Firm* — Oblon, McClelland, Maier & Neustadt, L.L.P.

(57) ABSTRACT

According to one embodiment, a semiconductor memory device includes a memory cell including a transistor formed of an oxide semiconductor, an insulation film, and a control electrode, and a capacitance element configured to store a charge, the memory cell being configured to store a coupling weight of a neuron model by a charge amount accumulated in the capacitance element; and a control circuit configured to output a signal as a sum of a product between input data of the memory cell and the coupling weight.

13 Claims, 12 Drawing Sheets

(51) Int. Cl.
  *G11C 11/4091* (2006.01)
  *G11C 11/54* (2006.01)

(56) References Cited

U.S. PATENT DOCUMENTS

| | | | |
|---|---|---|---|
| 2002/0032670 A1* | 3/2002 | Watanabe | G06N 3/063 |
| | | | 706/33 |
| 2009/0083202 A1 | 3/2009 | Tanaka et al. | |
| 2012/0075917 A1 | 3/2012 | Takemura | |
| 2015/0100532 A1 | 4/2015 | Yamaguchi | |
| 2015/0120629 A1* | 4/2015 | Matsuoka | G06N 3/08 |
| | | | 706/25 |
| 2015/0269483 A1* | 9/2015 | Nishitani | G06N 3/084 |
| | | | 706/25 |

FOREIGN PATENT DOCUMENTS

| | | |
|---|---|---|
| JP | 5789465 | 10/2015 |
| JP | 5858020 | 2/2016 |

\* cited by examiner

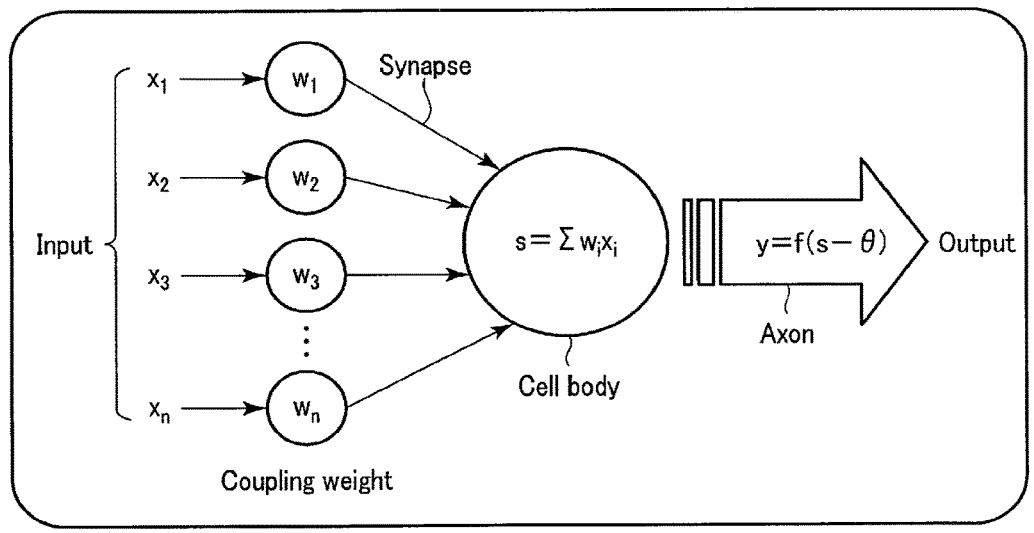
$$s = \sum_{i=1}^{n} w_i x_i$$
$$y = f(s - \theta)$$
$w_i$ : Coupling weight
$x_i$ : Input
$y$ : Output
$\theta$ : Threshold
F I G. 1
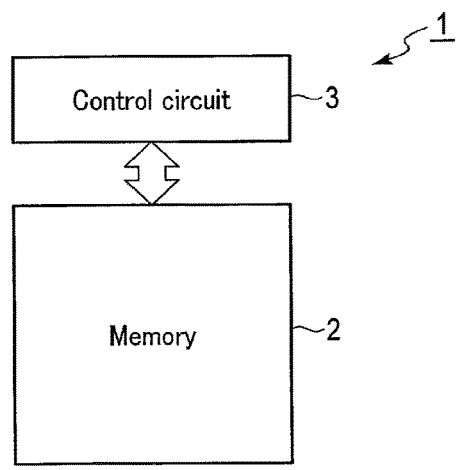
F I G. 2

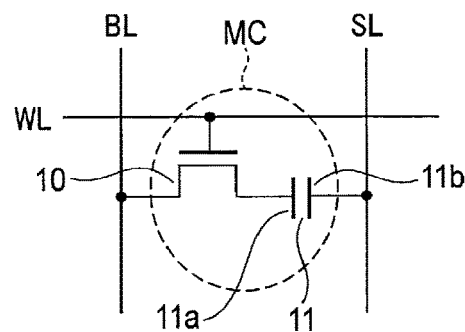
F I G. 3
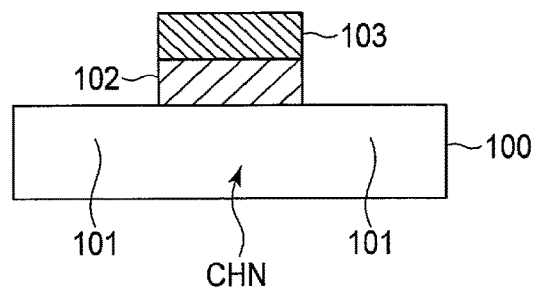
F I G. 4
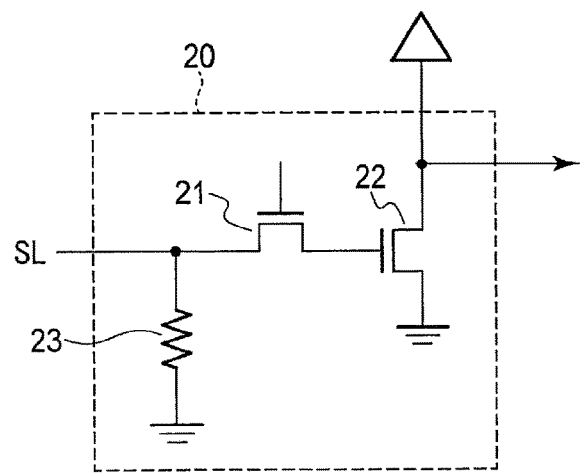
F I G. 5

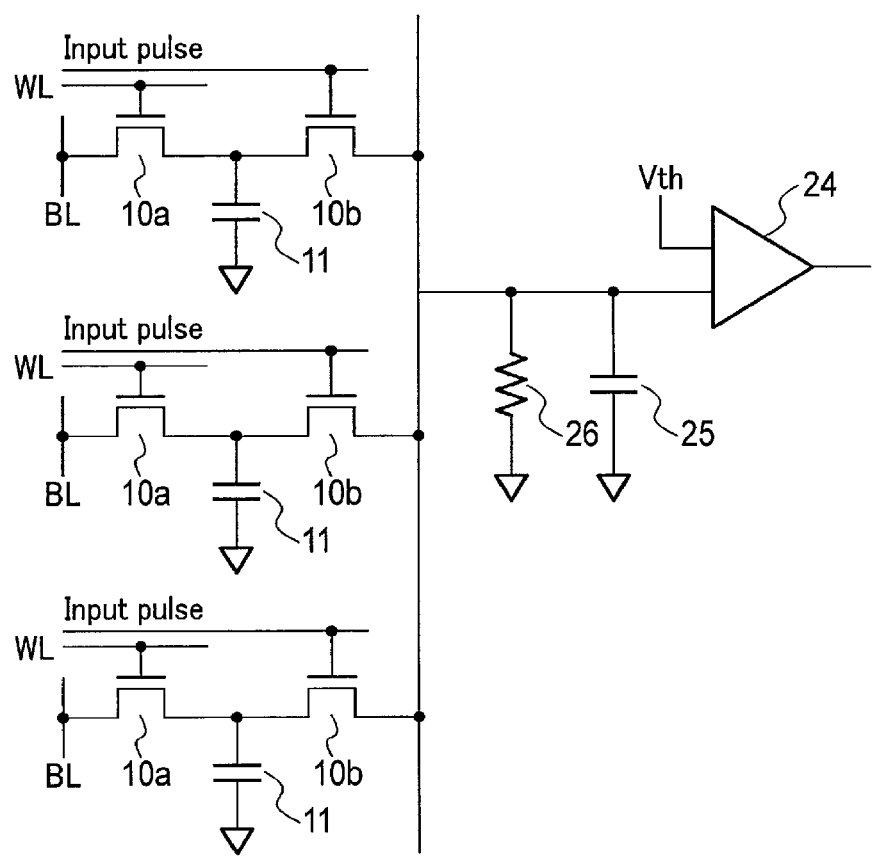
F I G. 9

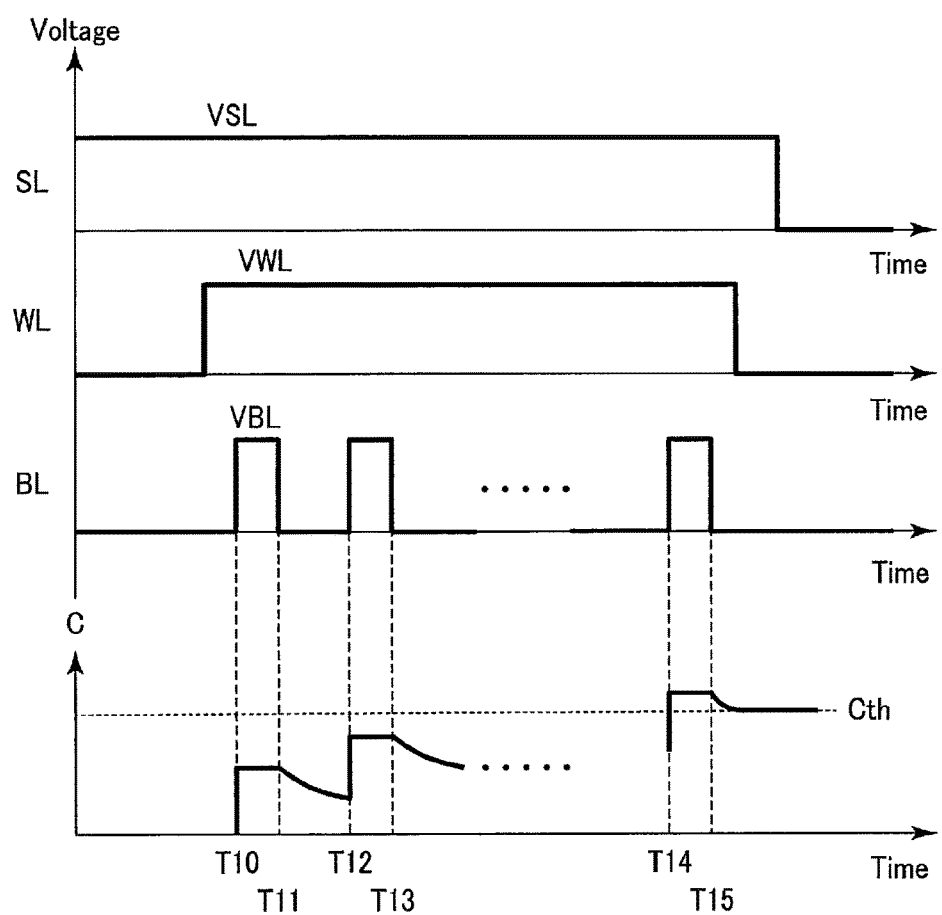
F I G. 11

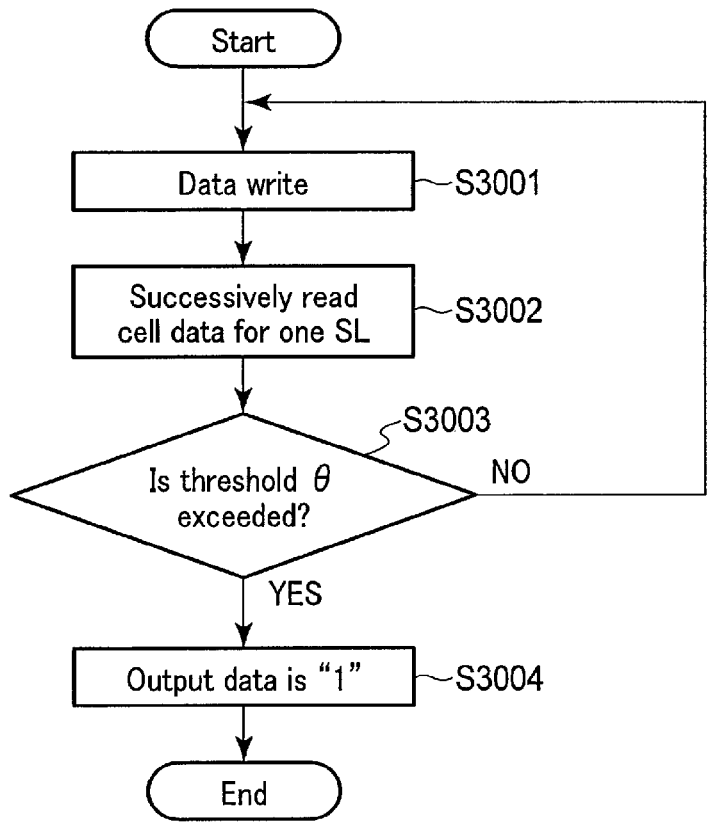
F I G. 13

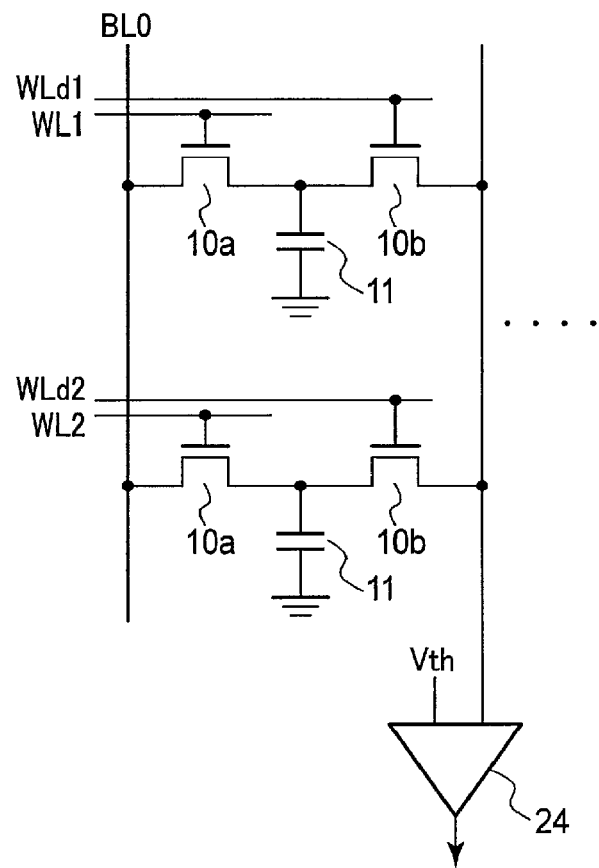
F I G. 15
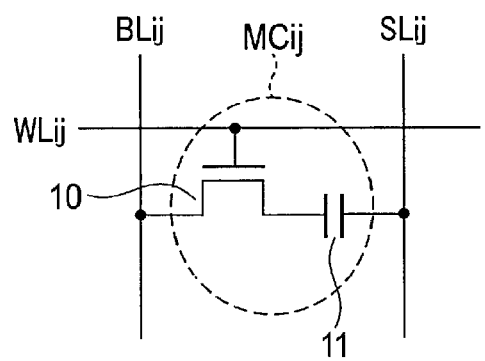
F I G. 16

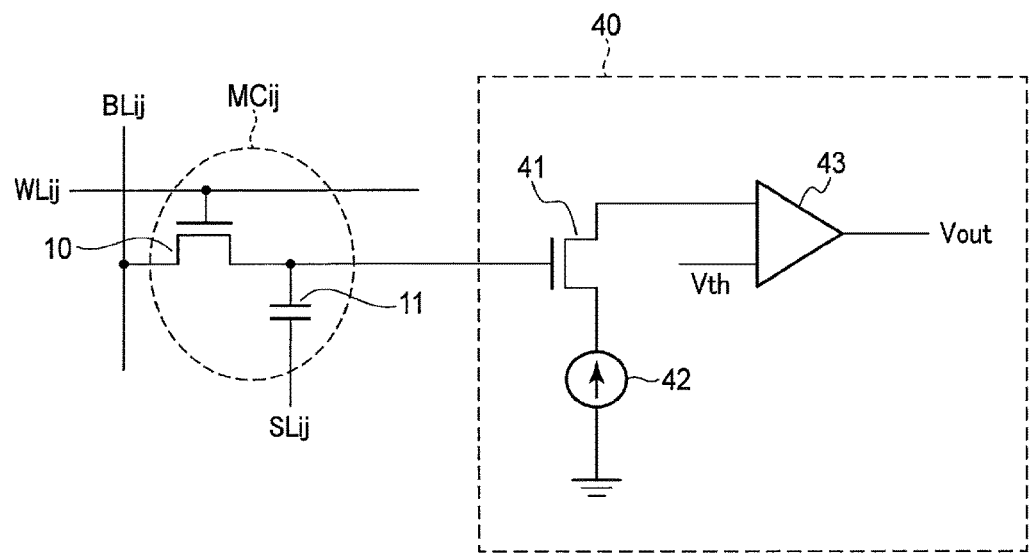
F I G. 17
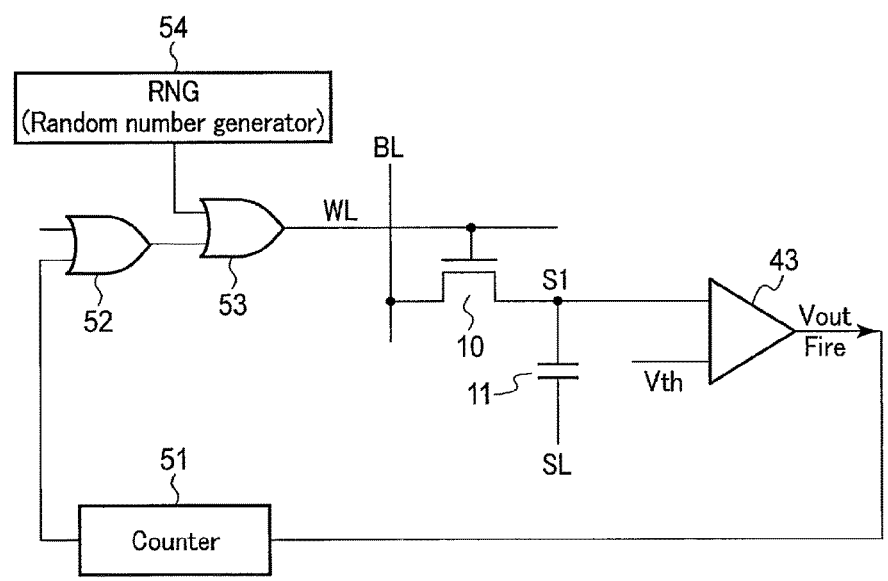
F I G. 18

SEMICONDUCTOR MEMORY DEVICE INCLUDING A MEMORY CELL WITH FIRST AND SECOND TRANSISTORS

CROSS-REFERENCE TO RELATED APPLICATIONS

This application is based upon and claims the benefit of priority from prior Japanese Patent Application No. 2017-054791, filed Mar. 21, 2017; the entire contents of which are incorporated herein by reference.

FIELD

Embodiments described herein relate generally to a semiconductor memory device.

BACKGROUND

As a configuration of a semiconductor memory device, a configuration utilizing a neuron model has been studied.

BRIEF DESCRIPTION OF THE DRAWINGS

FIG. 1 is a view which schematically illustrates a single neuron model.

FIG. 2 is a block diagram illustrating the configuration of a memory device according to a first embodiment.

FIG. 3 is a circuit diagram illustrating a memory cell of the memory device according to the first embodiment.

FIG. 4 is a cross-sectional view of a select transistor of the memory device according to the first embodiment.

FIG. 5 is a circuit diagram illustrating a control circuit of the memory device according to the first embodiment.

FIG. 9 is a circuit diagram illustrating memory cells of a memory device and a judgment unit of a control circuit according to Modification 2 of the first embodiment.

FIG. 11 is a view illustrating the relationship between the source line voltage, word line voltage, bit line voltage, and charge stored in the capacitance element, at a write operation time of the memory device according to the second embodiment.

FIG. 13 is a flowchart illustrating the operation of the memory device according to the third embodiment.

FIG. 15 is a circuit diagram illustrating memory cells of a memory device and a judgment unit of a control circuit according to Modification 1 of the third embodiment.

FIG. 16 is a circuit diagram illustrating a memory cell of a memory device according to Modification 2 of the third embodiment.

FIG. 17 is a circuit diagram illustrating a memory cell of a memory device and a judgment unit of a control circuit according to Modification 3 of the third embodiment.

FIG. 18 is a circuit diagram illustrating a memory cell of a memory device and a judgment unit of a control circuit according to Modification 4 of the third embodiment.

DETAILED DESCRIPTION

Figure 6:
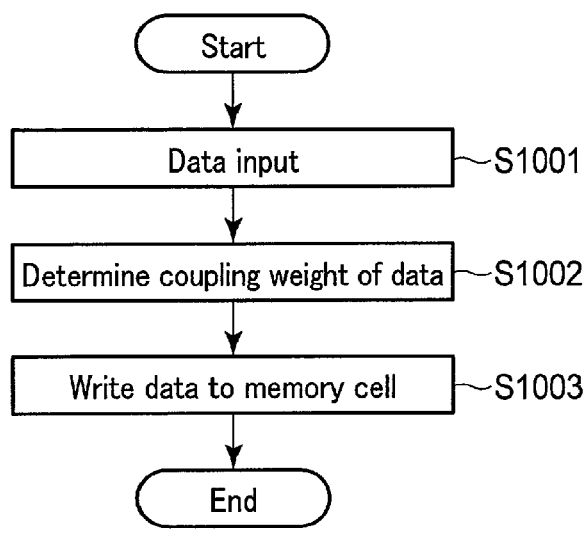
FIG. 6 is a flowchart illustrating a write operation of the memory device according to the first embodiment.

In general, according to one embodiment, a semiconductor memory device includes a memory cell including a transistor formed of an oxide semiconductor, an insulation film, and a control electrode, and a capacitance element configured to store a charge, the memory cell being configured to store a coupling weight of a neuron model by a charge amount accumulated in the capacitance element; and a control circuit configured to output a signal as a sum of a product between input data of the memory cell and the coupling weight.

Hereinafter, the details of embodiments will be described with reference to the accompanying drawings. In the description below, common parts are denoted by like reference numerals throughout the drawings.

<1> First Embodiment

<1-1> Principle

To begin with, referring to FIG. 1, the basic principle according to a first embodiment will be described. FIG. 1 is a view which schematically illustrates a single neuron model.

A neural network with multiple inputs and one output is an artificial fabrication of a nervous system which is typified by the brain. The basic structure of a neuron includes a part of a main body called "cell body", a great number of parts called "dendrites" projecting dendritically from the main body, and a part of a single long fiber called "axon". The neuron model is a model imitating this basic structure of the neuron, and is represented, for example, as illustrated in FIG. 1.

Here, the cell body is an information processing element, and each dendrite is coupled to an axon process of another cell body via a coupling part called "synapse". Specifically, a plurality of input signals come in the part of the cell body. In addition, one output is produced from the axon process.

To be more specific, in the cell body, a sum of products between inputs $x_i$ and coupling weights $w_i$, i.e. $s=\Sigma w_i x_i$, is calculated. In addition, $y=f(s-\theta)$ (where $\theta$ is a threshold), is output from the axon process.

By connecting a plurality of such information processing elements each with multiple inputs and one output, the neural network can be constituted. In addition, the part of the cell body produces a sigmoid function-like output in relation to an input signal. In brief, another main feature is that the part of the cell body performs such a nonlinear behavior as to produce an output in relation to an input signal at a level which is not less than a certain threshold $\theta$, and as to produce no output in relation to an input signal at a level which is less than the threshold $\theta$. Thus, in the information processing element, it is imperative that the information processing element behaves in a nonlinear manner in relation to the input signal. Hereinafter, a description will be given of a memory device (synapse-imitating circuit) which constitutes the neuron model as illustrated in FIG. 1.

<1-2> Configuration
<1-2-1> Memory Device

Referring to FIG. 2, the outline of a memory device according to the first embodiment will be described. FIG. 2 is a block diagram illustrating the configuration of the memory device of the first embodiment.

As illustrated in FIG. 2, a memory device 1 includes a memory 2 and a control circuit 3.

The memory 2 is a memory area including a plurality of memory cells.

The control circuit 3 supplies various signals to the memory 2, and processes signals received from the memory 2.

<1-2-2> Memory Cell

Referring to FIG. 3, the memory cell of the memory device according to the first embodiment will be described. FIG. 3 is a circuit diagram illustrating the memory cell of the memory device according to the first embodiment. Here, for the purpose of simplicity, the description is given, focusing on one memory.

As illustrated in FIG. 3, a memory cell MC includes a select transistor 10 and a capacitance (capacitance element) 11.

The select transistor 10 includes one end connected to a bit line BL, the other end connected to the capacitance 11, and a gate electrode connected to a word line WL. The select transistor 10 is, for example, an NMOS transistor.

The capacitance 11 includes a first electrode 11a connected to the other end of the select transistor 10, and includes a second electrode 11b connected to a source line SL.

The memory cell MC can store multilevel data in accordance with the amount of charge stored in the first electrode 11a of the capacitance 11. Thus, a plurality of data x ($x_1$ to $x_n$) are input to the memory cell MC via the control circuit 3. Specifically, multiple inputs are made possible to one memory cell MC. In this manner, the memory cell MC has the function of the synapse, and the charge amount stored in the capacitance 11 corresponds to the coupling weight w.

Referring to FIG. 4, the select transistor 10 will be descried. FIG. 4 is a cross-sectional view of the select transistor of the memory device according to the first embodiment.

As illustrated in FIG. 4, the select transistor 10 includes an oxide semiconductor 100; two source/drain regions 101 provided in surface regions of the oxide semiconductor 100; a channel region CHN provided in surface regions of the oxide semiconductor 100 and sandwiched between the two source/drain regions 101; an insulation film 102 provided on the channel region CHN of the oxide semiconductor 100; and a control electrode 103 provided on the insulation film 102.

The oxide semiconductor 100 is, for example, InGaZnO formed of indium (In), gallium (Ga), zinc (Zn) and oxide (O). Needless to say, any other structure may be adopted if the structure functions as the oxide semiconductor.

Incidentally, an arbitrary insulating material is applicable as the insulation film 102.

Besides, an arbitrary conductive material is applicable as the control electrode 103.

In the meantime, a transistor, in which an oxide semiconductor is applied as the substrate, has a characteristic of low leakage, compared to a transistor in which silicon is applied as the substrate. Thus, in the memory device, an arbitrary amount of charge can be stored in the first electrode 11a of the capacitance 11, and one memory cell MC can store multilevel data. In addition, since the transistor, in which the oxide semiconductor is applied as the substrate, is adopted, the memory device can arbitrarily control the leakage by applying an arbitrary voltage to the gate electrode.

<1-2-3> Control Circuit

Referring to FIG. 5, the control circuit 3 of the memory device according to the first embodiment will be described. FIG. 5 is a circuit diagram illustrating the control circuit of the memory device according to the first embodiment.

As illustrated in FIG. 5, the control circuit 3 includes a judgment unit 20. The judgment unit 20 is composed of a select transistor 21, an output transistor 22, and a resistor 23. A source line SL of the memory cell MC of the memory 2 is connected to one end of the select transistor 21. The other end of the select transistor 21 is connected to the gate electrode of the output transistor 22. By the select transistor 21 being turned on, the data stored in the memory cell MC is applied to the gate of the output transistor 22. The threshold of the output transistor 22 corresponds to the threshold θ in the neuron model illustrated in FIG. 1. When the data stored in the memory cell MC exceeds the threshold θ, an output is delivered from the drain of the output transistor 22. Specifically, the output transistor 22 outputs a signal as a sum of the product between the input data of the memory cell and the coupling weight. This judgment unit 20 can be thought to be a neuron.

<1-3> Operation

The operation of the memory device according to the first embodiment will be described.

<1-3-1> Write Operation

Referring to FIG. 6, a write operation of the memory device according to the first embodiment will be described. FIG. 6 is a flowchart illustrating the write operation of the memory device of the first embodiment.

[Step S1001]

Data is input to the control circuit 3 from the outside.

[Step S1002]

Based on the data, the control circuit 3 sets coupling weights w ($w_1$ to $w_n$). In addition, based on the input data, the control circuit 3 determines the coupling weights w.

[Step S1003]

Based on the determined coupling weights w, the control circuit 3 determines a voltage which is applied to the word line WL, and executers write to the memory cell MC.

<1-3-2> Read Operation

Figure 7:
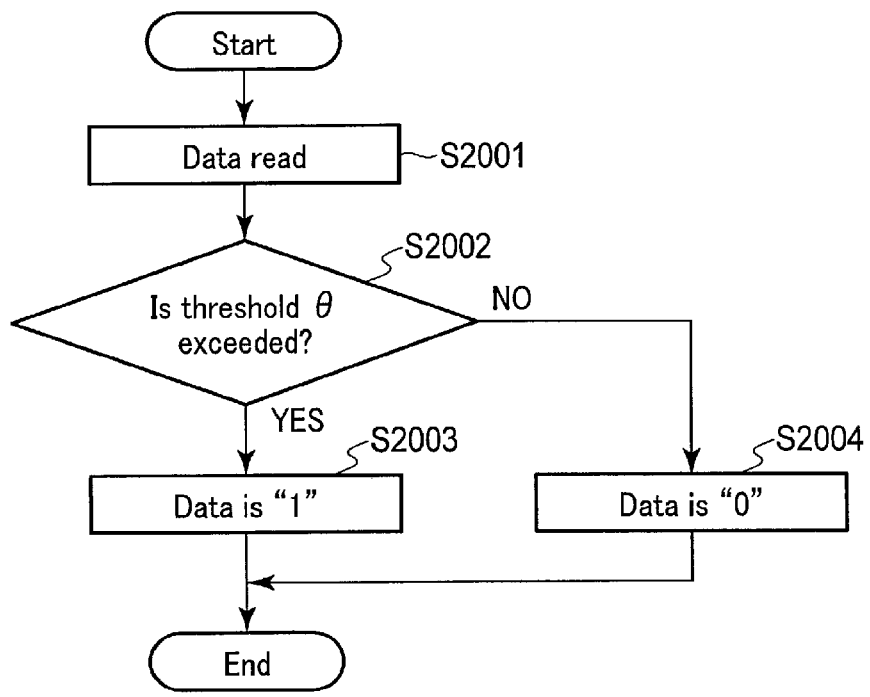
FIG. 7 is a flowchart illustrating a read operation of the memory device according to the first embodiment.

Referring to FIG. 7, a read operation of the memory device according to the first embodiment will be described. FIG. 7 is a flowchart illustrating the read operation of the memory device of the first embodiment. Here, for the purpose of simplicity, the case is described in which data is read from one memory cell.

[Step S2001]

The control circuit 3 reads data from the source line SL to which a selected memory cell MC is connected.

[Step S2002]

The control circuit 3 sets the select transistor 21, to which a selected source line SL is connected, in the ON state. The output transistor 22 judges whether the data stored in the selected memory cell MC exceeds the threshold θ.

[Step S2003]

When the output transistor 22 is set in the ON state, the control circuit 3 judges that the data stored in the selected memory cell MC has exceeded the threshold θ. In this case, the control circuit 3 outputs "1" data.

[Step S2004]

When the output transistor 22 is set in the OFF state, the control circuit 3 judges that the data stored in the selected memory cell MC does not exceed the threshold θ. In this case, the control circuit 3 outputs "0" data.

<1-4> Advantageous Effects

According to the above-described embodiment, in the select transistor of the memory cell, the oxide semiconductor is applied as the substrate. Compared to the transistor in which silicon is applied as the substrate, the leakage of the memory cell MC is small. Thus, a plurality of data can be stored in one memory cell.

Here, in order to explain the advantageous effects of the above-described embodiment, a comparative example will be described.

In a synapse-imitating circuit according to the comparative example, which employs a transistor in which silicon is applied as the substrate, it is difficult to store multilevel data in one memory cell MC due to low retention characteristics. In addition, in the synapse-imitating circuit according to the comparative example, one data is stored in one memory cell MC, and accordingly the circuit area becomes large.

However, in the above-described synapse-imitating circuit, the memory cell MC can store multilevel data. Thus, an increase in circuit area of the memory 2 can be suppressed. In addition, since the retention characteristics of the memory cell MC are high, a high-quality memory device can be provided.

<1-5> Modification 1

Figure 8:
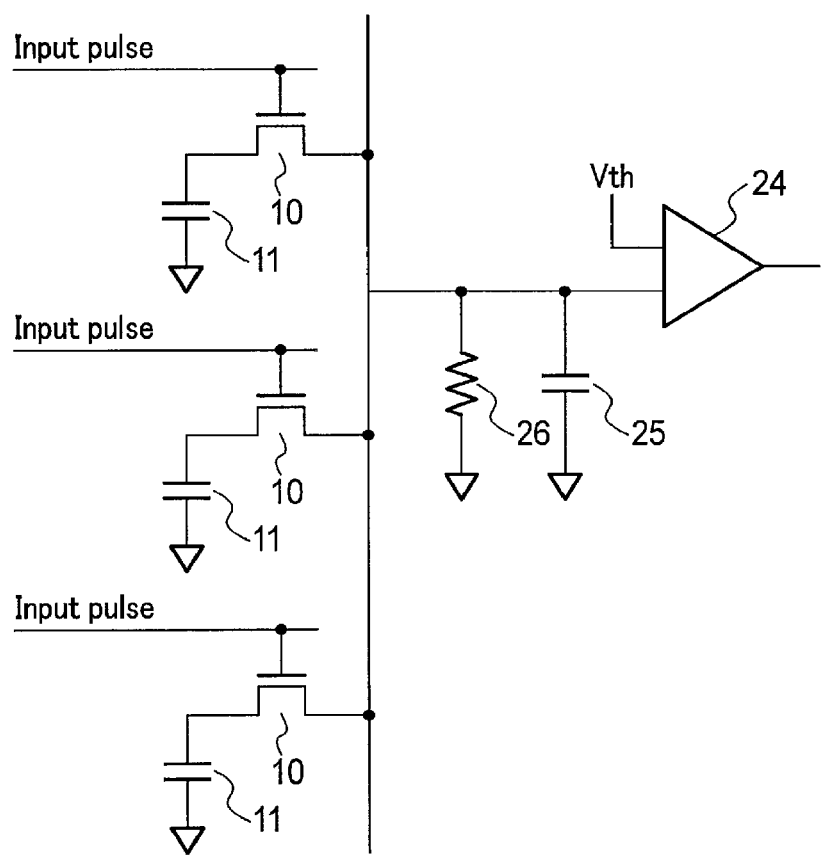
FIG. 8 is a circuit diagram illustrating memory cells of a memory device and a judgment unit of a control circuit according to Modification 1 of the first embodiment.

Referring to FIG. 8, Modification 1 of the first embodiment will be described. FIG. 8 is a circuit diagram illustrating memory cells of a memory device 2 and a judgment unit of a control circuit 3 according to Modification 1 of the first embodiment.

The above-described memory cell MC is also applicable to an array structure like the array structure of a DRAM.

As the judgment unit, a comparator 24 is applicable. A voltage, which is accumulated in the memory cell MC, is input to a first input terminal of the comparator 24, and a reference voltage Vth is input to a second input terminal of the comparator 24.

In addition, the control circuit 3 includes a capacitance 25 and a resistor 26.

In this modification, an analog value is stored in the capacitance 11 of the memory cell MC, and thereby a coupling weight w is set. Data read is described in brief. At a read time, the control circuit 3 turns on the select transistor 10. The comparator 24 judges data by determining a capacitance of the memory cell MC at the read start time, and a decrease in potential due to discharge.

<1-6> Modification 2

Referring to FIG. 9, Modification 2 of the first embodiment will be described. FIG. 9 is a circuit diagram illustrating memory cells of a memory device and a judgment unit of a control circuit 3 according to Modification 2 of the first embodiment.

In the present modification, such a configuration may be adopted that one memory cell is provided with two select transistors 10a and 10b. Each of the select transistors 10a and 10b is, like the select transistor 10, a select transistor in which the oxide semiconductor is applied as the substrate. The select transistor 10a is a select transistor which is turned on when data is written to the capacitance 11. The select transistor 10b is a transistor which is turned on when data is read from the capacitance 11.

<2> Second Embodiment

A second embodiment will be described. In the second embodiment, a description is given of the case in which STM (Short term memory) data or LTM (Long term memory) data is stored in the memory device. Incidentally, the basic configuration and basic operation of the memory device according to the second embodiment are the same as those of the memory device according to the above-described first embodiment. Accordingly, descriptions are omitted of the matters described in the first embodiment, and matters which can easily be guessed from the first embodiment.

<2-1> STM

Figure 10:
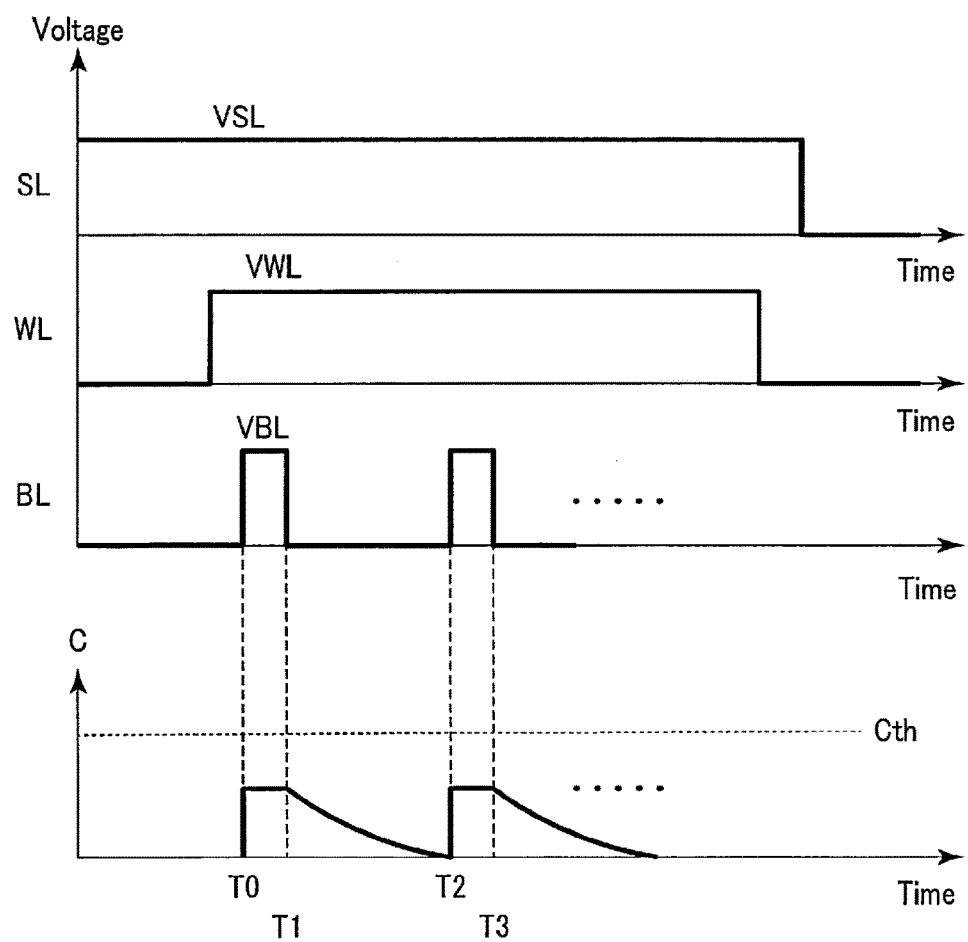
FIG. 10 is a view illustrating the relationship between a source line voltage, a word line voltage, a bit line voltage, and a charge stored in a capacitance element, at a write operation time of a memory device according to a second embodiment.

Referring to FIG. 10, a description will be given of the case in which STM (Short term memory) data is stored in the memory device. FIG. 10 is a view illustrating the relationship between a source line voltage, a word line voltage, a bit line voltage, and a charge stored in a capacitance element, at a write operation time of the memory device according to the second embodiment. Here, for the purpose of simplicity, an example is described in which the control circuit 3 recognizes that data to be stored is STM data.

When the control circuit 3 stores STM data in the memory 2, the control circuit 3 sets the voltage of the source line SL at VSL, and sets the voltage of the word line WL at VWL. The voltage VWL of this word line WL may be varied based on the above-described coupling weight w. Here, for the purpose of simplicity, it is assumed that the voltage VWL is a voltage which turns on the select transistor 10.

In addition, in a period of time instant T0 to time instant T1, the control circuit 3 sets the voltage of the bit line BL at VBL. The voltage VBL may be varied based on the above-described coupling weight w. At this time point, the charge, which is accumulated in the first electrode 11a of the capacitance 11, does not reach the threshold (Cth).

In addition, in a period of time instant T1 to time instant T2, the control circuit 3 sets the voltage of the bit line BL at VSS. During this period, since the voltage VWL is being applied to the word line WL, the select transistor 10 is in the ON state. Thus, the charge is gradually extracted from the first electrode 11a of the capacitance 11.

Besides, at time instant T2 when the charge is completely extracted from the first electrode 11a of the capacitance 11, the control circuit 3 sets the voltage of the bit line BL at VBL.

In this manner, the control circuit 3 can store the STM data in the memory 2, by controlling the timing of applying the voltage to the word line WL and the write voltage (VBL) to the bit line BL. Specifically, the control circuit 3 can store the STM data in the memory 2, by writing data so as not to reach the threshold Cth after the charge was completely extracted from the first electrode 11a of the capacitance 11.

In the meantime, by controlling various voltages, the control circuit 3 can control the degree of extraction of charge (a forgetting rate, or a time constant of capacitance discharge) from the first electrode 11a of the capacitance 11. Here, the extraction of charge from the first electrode 11a of the capacitance 11 is described also as "forgetting".

When the control circuit 3 reads STM data from the memory 2, the control circuit 3 keeps the select transistor 10 in the ON state, for example, at the time of the read operation.

In this manner, when the control circuit 3 stores the STM data in the memory 2, the control circuit 3 operates to extract, in a fixed period, the charge from the first electrode 11a of the capacitance 11.

<2-2> LTM

Referring to FIG. 11, a description will be given of the case in which LTM (Long term memory) data is stored in the memory device. FIG. 11 is a view illustrating the relationship between the source line voltage, word line voltage, bit line voltage, and charge stored in the capacitance element, at a write operation time of the memory device according to the second embodiment. Here, for the purpose of simplicity, an example is described in which the control circuit 3 recognizes that data to be stored is LTM data.

When the control circuit 3 stores LTM data in the memory 2, the control circuit 3 sets the voltage of the source line SL at VSL, and sets the voltage of the word line WL at VWL. The voltage VWL of this word line WL may be varied based on the above-described coupling weight w. Here, for the purpose of simplicity, it is assumed that the voltage VWL is a voltage which turns on the select transistor 10.

In addition, in a period of time instant T10 to time instant T11, the control circuit 3 sets the voltage of the bit line BL at VBL. The voltage VBL may be varied based on the above-described coupling weight w. At this time point, the charge, which is accumulated in the first electrode 11a of the capacitance 11, does not reach the threshold (Cth).

In addition, in a period of time instant T11 to time instant T12, the control circuit 3 sets the voltage of the bit line BL at VSS. During this period, since the voltage VWL is being applied to the word line WL, the select transistor 10 is in the ON state. Thus, the charge is gradually extracted from the first electrode 11a of the capacitance 11.

Besides, at time instant T12 before the charge is completely extracted from the first electrode 11a of the capacitance 11, the control circuit 3 sets the voltage of the bit line BL at VBL.

In this manner, the control circuit 3 repeats write before the charge is completely extracted from the first electrode 11a of the capacitance 11. Thereby, the charge accumulated in the first electrode 11a of the capacitance 11 exceeds the threshold Cth. In the case in which the charge accumulated in the first electrode 11a of the capacitance 11 exceeds the threshold Cth, the control circuit 3 handles this case such that that LTM data is stored in the memory cell.

In this manner, the control circuit 3 can store the LTM data in the memory 2, by controlling the timing of applying the voltage to the word line WL and the write voltage (VBL) to the bit line BL. Specifically, the control circuit 3 can store the LTM data in the memory 2, by writing data so as to reach the threshold Cth before the charge is completely extracted from the first electrode 11a of the capacitance 11.

When the control circuit 3 stores LTM data in the memory 2, the control circuit 3 operates so as not to extract the charge from the first electrode 11a of the capacitance 11.

As described in the first embodiment, since the select transistor 10 is small in leakage, the retention characteristics are excellent, and the LTM data can properly be stored.

In the above description, the example was described in which the control circuit 3 recognizes whether the data to be stored in the memory 2 is STM data or LTM data. However, the control circuit 3 may not recognize whether the data to be stored in the memory 2 is STM data or LTM data. In this case, by executing a refresh operation (read/rewrite) of the DRAM, the control circuit 3 may judge whether the data stored in the memory cell MC is STM data or LTM data. When the control circuit 3 judges that the data stored in the memory cell MC is the STM data, the control circuit 3 extracts the charge from the first electrode 11a of the capacitance 11. In addition, when the control circuit 3 judges that the data stored in the memory cell MC is the LTM data, the control circuit 3 executes control so as not to extract the charge from the first electrode 11a of the capacitance 11. The control circuit 3 can control, by various voltages, the probability of transition from STM data to LTM data.

<2-3> Advantageous Effects

According to the above-described embodiment, the control circuit can efficiently manage the STM data or LTM data by controlling various voltages.

Here, in order to explain the advantageous effects of the above-described embodiment, a comparative example will be described.

As a configuration of the synapse-imitating circuit, a configuration utilizing a filament-type ReRAM has been thought. In a synapse-imitating circuit according to the comparative example, an operation corresponding to learning is realized by controlling a height and thickness of an Ag atom filament by the amplitude, time, and number of times of a write voltage pulse input to the ReRAM. In the synapse-imitating circuit according to the comparative example, an operation corresponding to forgetting is imitated by such a phenomenon that a filament disappears by Ag atom diffusion in a medium. Thus, in the synapse-imitating circuit according to the comparative example, the forgetting rate (retention) of storage is uniquely determined by a material system.

However, according to the above-described embodiment, by the control circuit 3 controlling various voltages, it is possible to reproduce a synapse-imitating circuit having arbitrary characteristics (e.g. retention characteristics) without depending on characteristics of material.

<3> Third Embodiment

A third embodiment will be described. In the third embodiment, a description is given of the case in which a spiking neuron model is applied to a memory device. Incidentally, the basic configuration and basic operation of the memory device according to the third embodiment are the same as those of the memory devices according to the above-described first and second embodiments. Accordingly, descriptions are omitted of the matters described in the first and second embodiment, and matters which can easily be guessed from the first and second embodiment.

<3-1> Memory

Figure 12:
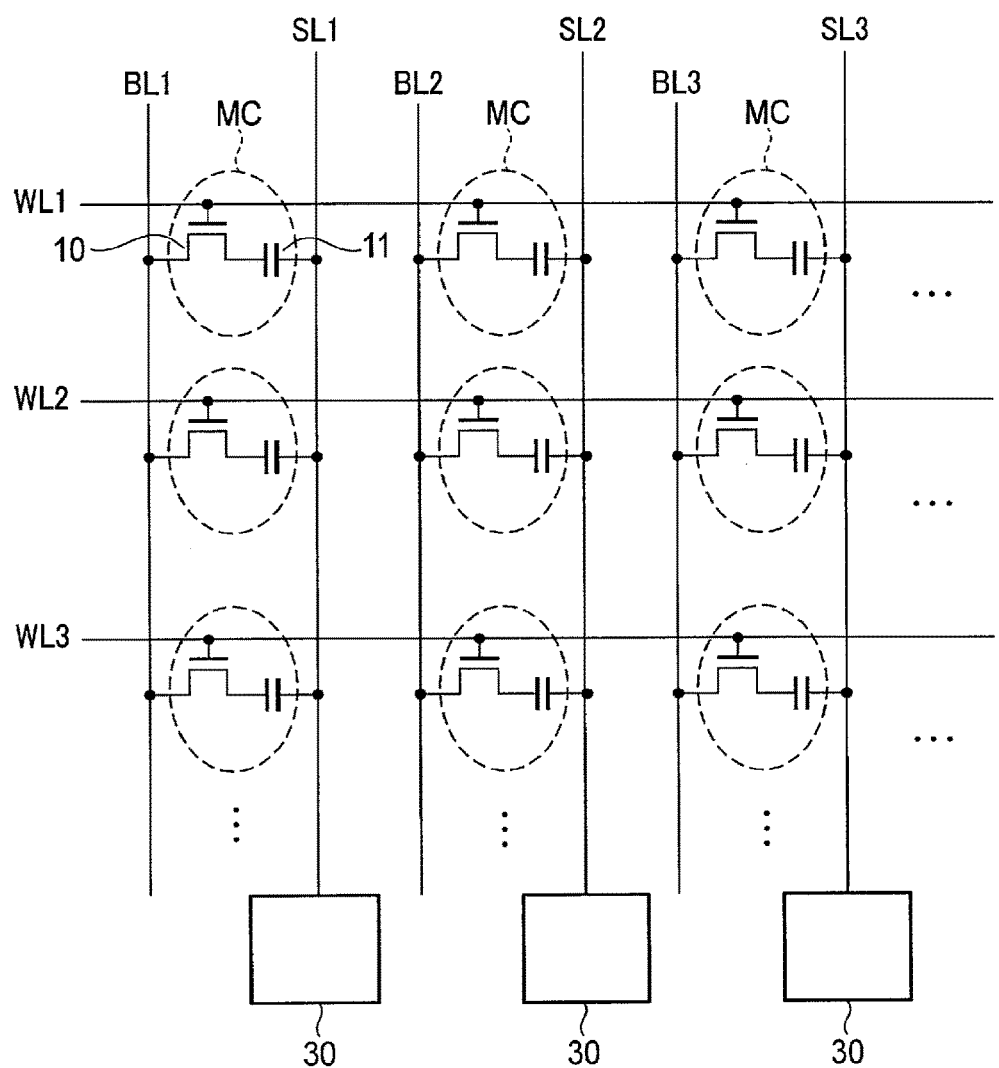
FIG. 12 is a circuit diagram illustrating a memory of a memory device according to a third embodiment.

Referring to FIG. 12, a memory of the memory device according to the third embodiment will be described. FIG. 12 is a circuit diagram illustrating the memory of the memory device of the third embodiment.

As illustrated in FIG. 12, memory cells MC are arranged in an array. The configuration of each of the memory cells MC is the same as the configuration described with reference to FIG. 3.

In addition, a judgment unit 30 of the control circuit 3 is connected to an end portion of each source line SL. The judgment unit 20 judged data at a predetermined timing, whereas this judgment unit 30 constantly judges data of the source line SL.

<3-2> Operation

Referring to FIG. 13, an operation of the memory device according to the third embodiment will be described. FIG. 13 is a flowchart illustrating the operation of the memory device of the third embodiment. Here, a description is given of an operation in the case in which a spiking neuron model is applied to the memory device.

[Step S3001]

Data is input to the control circuit 3 from the outside.

Based on the data, the control circuit 3 sets coupling weights w ($w_1$ to $w_n$). In addition, based on the input data, the control circuit 3 determines the coupling weights w.

Based on the determined coupling weights w, the control circuit 3 determines the voltage which is applied to the word lines WL, and executes write to the memory cells MC.

[Step S3002]

The control circuit 3 successively judges the data of the source line SL that is a target of read.

[Step S3003]

The control circuit 3 judges whether the data, which is read from the selected source line SL, exceeds the threshold. When the control circuit 3 judges that the data does not exceed the threshold, the control circuit 3 repeats step S3001.

[Step S3004]

When the control circuit 3 judges that the data exceeds the threshold, the control circuit 3 outputs "1" data. In addition, the control circuit 3 erases the data of the memory cells MC which are connected to the selected source line SL.

<3-3> Concrete Example

Figure 14:
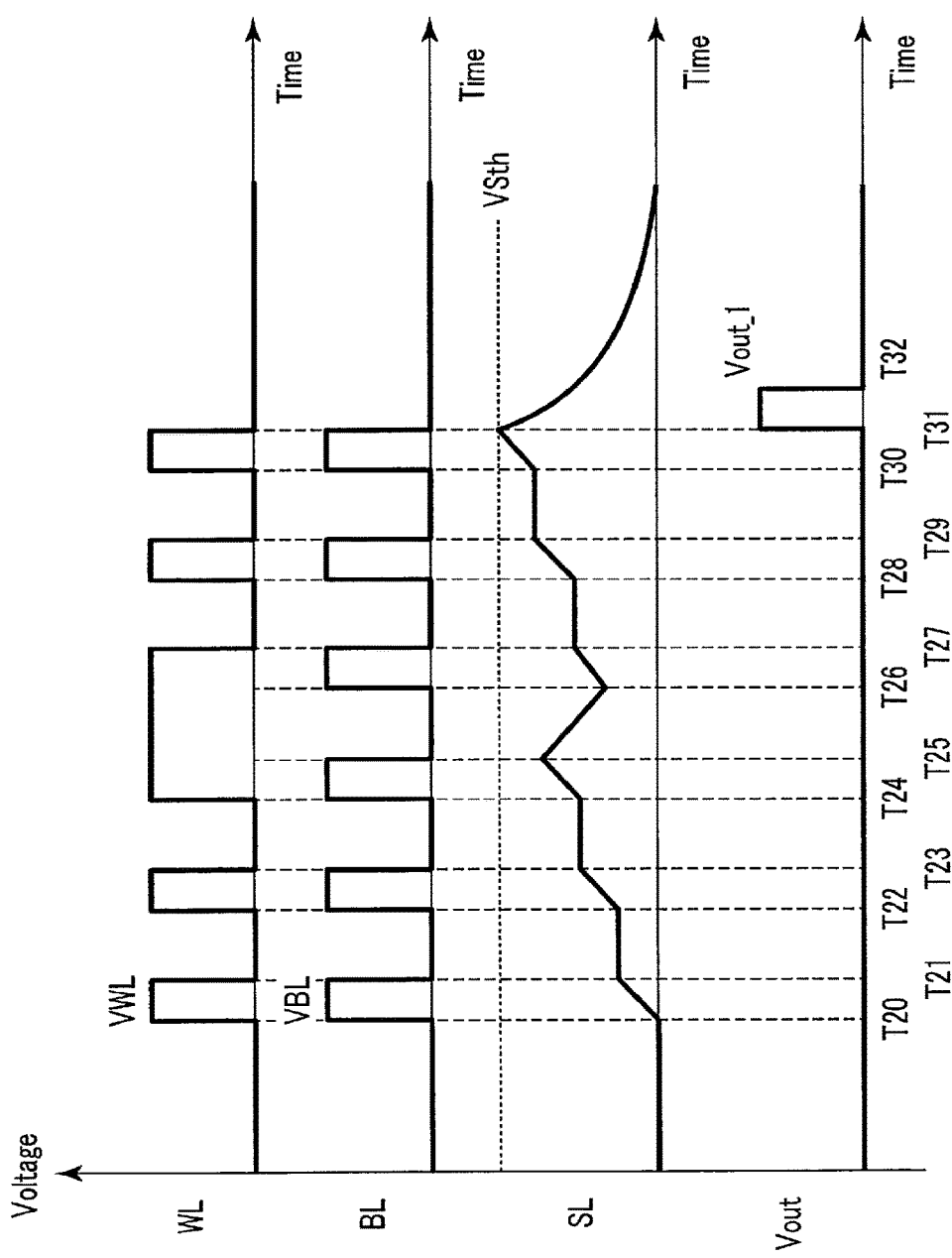
FIG. 14 is a view illustrating the relationship between a word line voltage, a bit line voltage, a source line voltage, and an output voltage from a judgment unit, at a write operation time of the memory device according to the third embodiment.

Next, referring to FIG. 14, a concrete operation of the memory device according to the third embodiment will be described. FIG. 14 is a view illustrating the relationship between a word line voltage, a bit line voltage, a source line voltage, and an output voltage from the judgment unit, at a write operation time of the memory device according to the third embodiment.

In a period of time instant T20 to time instant T21, the control circuit 3 applies the voltage VWL to the word line WL, and applies the voltage VBL to the bit line BL. The voltage VWL and voltage VBL may be varied based on the above-described coupling weight w. Here, for the purpose of simplicity, it is assumed that the voltage VWL is a voltage which turns on the select transistor 10. Thereby, data is written to the memory cell MC, and the potential of the source line SL rises.

In a period of time instant T21 to time instant T22, the control circuit 3 applies the voltage VSS to the word line WL and bit line BL. Thereby, the data of the memory cell MC is retained, and the potential of the source line SL is also retained.

In a period of time instant T22 to time instant T23, the control circuit 3 applies the voltage VWL to the word line WL, and applies the voltage VBL to the bit line BL. Thereby, data is written to the memory cell MC, and the potential of the source line SL rises.

In a period of time instant T23 to time instant T24, the control circuit 3 applies the voltage VSS to the word line WL and bit line BL. Thereby, the data of the memory cell MC is retained, and the potential of the source line SL is also retained.

In a period of time instant T24 to time instant T25, the control circuit 3 applies the voltage VWL to the word line WL, and applies the voltage VBL to the bit line BL. Thereby, data is written to the memory cell MC, and the potential of the source line SL rises.

In a period of time instant T25 to time instant T26, the control circuit 3 applies the voltage VSS to the bit line BL, while keeping the voltage of the word line WL. Thereby, a charge is extracted from the memory cell MC, and the potential of the source line SL lowers. In this manner, the control circuit 3 can intentionally cause leakage. This leakage is utilized, for example, in the adjustment of the coupling weight w.

In a period of time instant T26 to time instant T27, the control circuit 3 applies the voltage VBBL to the bit line BL, while keeping the voltage of the word line WL. Thereby, data is written to the memory cell MC, and the potential of the source line SL rises.

In a period of time instant T27 to time instant T28, the control circuit 3 applies the voltage VSS to the word line WL and bit line BL. Thereby, the data of the memory cell MC is retained, and the potential of the source line SL is also retained.

In a period of time instant T28 to time instant T29, the control circuit 3 applies the voltage VWL to the word line WL, and applies the voltage VBL to the bit line BL. Thereby, data is written to the memory cell MC, and the potential of the source line SL rises.

In a period of time instant T29 to time instant T30, the control circuit 3 applies the voltage VSS to the word line WL and bit line BL. Thereby, the data of the memory cell MC is retained, and the potential of the source line SL is also retained.

In a period of time instant T30 to time instant T31, the control circuit 3 applies the voltage VWL to the word line WL, and applies the voltage VBL to the bit line BL. Thereby, data is written to the memory cell MC, and the potential of the source line SL rises. By this write, the voltage of the source line exceeds a threshold VSth Thereby, the judgment unit 30 outputs Vout_1 as "1" data.

In addition, after the output of Vout_1 by the judgment unit 30, the control circuit 3 erases the data of the memory cell MC which is connected to the selected source line SL.

<3-4> Modification 1

Referring to FIG. 15, Modification 1 of the third embodiment will be described. FIG. 15 is a circuit diagram illustrating memory cells of a memory device and a judgment unit of a control circuit 3 according to Modification 1 of the third embodiment.

As illustrated in FIG. 15, in the third embodiment, the same array configuration as in Modification 2 of the first embodiment is applicable.

In the present modification, one memory cell is provided with two select transistors 10a and 10b. Each of the select transistors 10a and 10b is, like the select transistor 10, a transistor in which the oxide semiconductor is applied as the substrate. The select transistor 10a is a select transistor which is controlled by a first word line WL and is turned on when data is written to the capacitance 11. The select transistor 10b is a transistor which is controlled by a second word line WLd and is turned on when data is read from the capacitance 11.

<3-5> Modification 2

Referring to FIG. 16, Modification 2 of the third embodiment will be described. FIG. 16 is a circuit diagram illustrating a memory cell of a memory device according to Modification 2 of the third embodiment.

In the above description, the control circuit 3 writes data to a plurality of memory cells MC, and the control circuit 3 judges whether the potential of the source line SL exceeds the threshold or not, based on the data of the memory cells MC which are connected to the same source line SL. However, as illustrated in FIG. 16, the control circuit 3 may write data to one memory cell MC, and may judge whether the potential of the source line SL exceeds the threshold or not, based on the data of the memory cell MC.

<3-6> Modification 3

Referring to FIG. 17, Modification 3 of the third embodiment will be described. FIG. 17 is a circuit diagram illustrating a memory cell of a memory device and a judgment unit of a control circuit according to Modification 3 of the third embodiment.

In the above description, the control circuit 3 judged whether the potential of the source line SL exceeds the threshold or not. However, as illustrated in FIG. 17, a judgment unit 40 may directly judge the potential of a node of an electrode 11a of the capacitance 11. The judgment unit 40 includes an output transistor 41, a constant current source 42, and a comparator 43.

One end of the output transistor 41 is connected to the constant current source 42, and the other end of the output transistor 41 is connected to a first input terminal of the comparator 43. The gate electrode of the output transistor 41 is connected to the electrode 11a of the capacitance 11. In addition, the comparator 43 compares the voltage which is supplied from the output transistor 41, and a comparative voltage Vth which is input to a second input terminal of the comparator 43, and generates a voltage Vout.

Instead of the above-described judgment unit 30, the judgment unit 40 as illustrated in FIG. 17 may be applied, and thereby the above-described operation can also be realized.

<3-7> Modification 4

Referring to FIG. 18, Modification 4 of the third embodiment will be described. FIG. 18 is a circuit diagram illustrating a memory cell of a memory device and a judgment unit of a control circuit according to Modification 4 of the third embodiment.

As illustrated in FIG. 18, the judgement unit 40 includes a comparator 43, a counter 51, an OR arithmetic circuit 52, an OR arithmetic circuit 53, and a random number generator 54.

While applying voltages to the bit line BL and word line WL (pulse) and executing write to the capacitance 11, the control circuit 3 sends a voltage (V(s1)) of an internal node (s1) of the capacitance 11 to the comparator 43. When the voltage (V(s1)) exceeds the threshold (Vth), the comparator 43 outputs (fires) the voltage Vout of "1". This comparator 43 can be thought to be a neuron. A leaky mode is expressed by stochastically turning on the word line WL voltage (VWL) by the appropriate random number generator 54.

In the meantime, each of the above-described memory cells MC is applicable to other neuron models which are not described in the present specification.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell including a first transistor comprising a first oxide semiconductor, a first insulation film, and a first control electrode, a second transistor comprising a second oxide semiconductor, a second insulation film, a second control electrode which is independent from the first control electrode, and a capacitance element configured to store a charge based on a product between input data and a coupling weight of a neuron model; wherein the first transistor is connected to the second transistor in series and the capacitor is connected to a common node of the first and second transistors; and
a control circuit configured to turn on the first transistor when the charge is written to the capacitance element, and to turn on the second transistor when the charge is read from the capacitance element.

2. The semiconductor memory device of claim 1, wherein the control circuit is configured to input a plurality of input data to the memory cell.

3. The semiconductor memory device of claim 1, wherein the control circuit is configured to control retention characteristics of the memory cell by adjusting a voltage which is supplied to the memory cell.

4. The semiconductor memory device of claim 1, wherein the control circuit is configured to control a forgetting rate of the memory cell by adjusting a voltage which is supplied to the memory cell.

5. The semiconductor memory device of claim 1, wherein the control circuit is configured to cause the memory cell to accumulate a charge such that the charge does not reach a threshold, after the charge accumulated in the memory cell is completely extracted.

6. The semiconductor memory device of claim 1, wherein the control circuit is configured to cause the memory cell to accumulate a charge such that the charge reaches a threshold, before the charge accumulated in the memory cell is completely extracted.

7. The semiconductor memory device of claim 6, wherein the control circuit is configured to execute such control as not to extract the charge from the memory cell, when the charge accumulated in the memory cell has reached the threshold.

8. The semiconductor memory device of claim 1, wherein the first transistor comprises:
the first oxide semiconductor:
a first channel region provided in surface regions of the first oxide semiconductor and sandwiched between a first source region and a first drain region;
a first insulation film provided on the first channel region of the first oxide semiconductor; and
the first control electrode provided on the first insulation film,
the second transistor comprises:
the second oxide semiconductor;
a second channel region provided in surface regions of the second oxide semiconductor and sandwiched between a second source region and a second drain region;
the second insulation film provided on the second channel region of the second oxide semiconductor; and
the second control electrode provided on the second insulation film.

9. The semiconductor memory device of claim 1, wherein the oxide semiconductor contains an indium oxide, a gallium oxide, and a zinc oxide.

10. The semiconductor memory device of claim 1, wherein the first transistor includes a first end connected to a bit line, a second end connected to the capacitance element, and the first control electrode connected to a word line, and
the second transistor includes a first end connected to a source line, a second end connected to the capacitance element, and the second control electrode connected to a control line different from the word line.

11. The semiconductor memory device of claim 10, wherein the capacitance element includes a first electrode connected to the second ends of the first and second transistors, and includes a second electrode.

12. The semiconductor memory device of claim 11, wherein the memory cell is configured to be capable of storing multilevel input data in accordance with an amount of charge stored in the first electrode of the capacitance element.

13. The semiconductor memory device of claim 1, wherein the first and second transistors are NMOS transistors.

\* \* \* \* \*